United States Patent
Campbell et al.

[11] Patent Number: 5,838,469
[45] Date of Patent: Nov. 17, 1998

[54] APPARATUS AND METHOD FOR PROCESSING DATA STORED IN PAGE-WISE MEMORY

[75] Inventors: Scott Patrick Campbell, Chatham; Kevin Richard Curtis, Summit, both of N.J.

[73] Assignee: Lucent Technologies Inc., Murray Hill, N.J.

[21] Appl. No.: 777,155

[22] Filed: Dec. 26, 1996

[51] Int. Cl.⁶ .............................. G11C 7/00; G11C 13/04; G03H 1/02

[52] U.S. Cl. ..................... 359/21; 365/189.07; 365/216

[58] Field of Search .................................. 359/1, 3, 4, 7, 359/21, 22, 24; 365/120, 124, 125, 189.01, 189.07, 189.08, 215, 216

[56] References Cited

U.S. PATENT DOCUMENTS

| 5,319,629 | 6/1994 | Henshaw et al. | 369/103 |
| 5,450,218 | 9/1995 | Heanue et al. | 359/21 |

OTHER PUBLICATIONS

Demetri Psaltis and Fai Mok, Holographic Memories, *Scientic American*, Nov. 1995, pp. 70–76.

Primary Examiner—Jon W. Henry
Assistant Examiner—Jared Treas
Attorney, Agent, or Firm—John M. Harman

[57] ABSTRACT

Embodiments of the invention include a data receiving apparatus and method of a holographic or other page-wise memory system for processing information read from the memory system's storage medium. The data apparatus includes a multi-dimensional array of pixel elements comprised of pixel detectors and corresponding pixel circuit. The pixel detectors detect information such as light information representing data stored in the memory system. The pixel circuits determine a value representative of the information detected by the individual pixel detectors. Additionally, the apparatus includes active processing circuitry advantageously fabricated in conjunction with the pixel circuits to provide additional "on-chip" processing capabilities, including analog inter-pixel processing. The advantageous arrangement of the additional processing improves processing times, reduces the unprocessed data flow out of the apparatus, and reduces circuitry design space and cost.

23 Claims, 6 Drawing Sheets

APPARATUS AND METHOD FOR PROCESSING DATA STORED IN PAGE-WISE MEMORY

BACKGROUND OF THE INVENTION

1. Field of the Invention

The invention relates to page-wise memory devices. More particularly, the invention relates to the retrieval and processing of data stored in holographic and other page-wise memory devices.

2. Description of the Related Art

The development of information storage devices and methods continues to increase the available information storage capacity. As part of this development, page-wise memory systems have been introduced as alternatives to conventional memory devices. Page-wise memory systems are characterized by the storage and readout of entire pages of information at one time. That is, unlike conventional memory devices, which store data in strings or bits, page-wise memories store and retrieve data in pages in the form of multi-dimensional arrayed patterns of data representations. For purposes of discussion herein, page-wise memory systems are memory systems capable of storing and retrieving data in the form of multi-dimensional arrays.

One type of page-wise memory is holographic memory. In general, a holographic memory system involves three-dimensional storage of holographic representations (i.e., holograms) of data elements as a pattern of varying refractive index and/or absorption imprinted in a storage medium such as a crystal of lithium niobate. Holographic memory systems are characterized by their high density storage potential and the potential speed with which the stored data is randomly accessed and transferred.

An advantage of page-wise memory systems is the speed at which information is transferred into and out of the memory system. Because page-wise memory systems manipulate data on a page-by-page basis, the speed at which data is stored and retrieved in page-wise systems compares favorably with conventional magnetic disk or compact disk (CD) storage systems, which store and retrieve information on a bit-by-bit basis or in one-dimensional strings of bits.

Another advantage of page-wise memory systems is storage capacity. In holographic memory systems, for example, each holographic image or page contains thousands or even millions of data elements. Theoretically, at the present time, it is believed that up to $10^{14}$ bits of information are storable in approximately 1.0 cm$^3$ of holographic storage medium.

However, reproduction of such stored data is less than ideal due to effects often inherent in holographic memory systems. For example, generally the square of the number of images or data pages imprinted in the storage medium typically is inversely proportional to the diffraction efficiency and thus the reliability of the holograms stored therein to be reproduced upon read out. Other factors often affecting the quality of the stored data include time-dependent fluctuations in light intensity throughout the storage medium, physical and optical disturbance of the mechanical relationship between system components, thermal expansion and other temperature-induced variations throughout the system, and other noise introduced into the system.

Because of the often poor quality in retrieving or reproducing such data, a data state typically is represented by comparisons of multiple data elements. For example, it is possible to employ some sort of differential encoding scheme, in which a particular data state sought to be retrieved results from the comparison of one data element to another. Alternatively, it is possible to use a reference encoding scheme, in which the value of a data element is compared to a known reference data element value. See, for example, U.S. Pat. No. 5,450,218.

When stored data information is to be recalled, detector arrays are used for reading the information emerging from the memory pages. Typically, the recalled holographic information is projected onto an imaging unit such as a charged coupled device (CCD), which is sensitive to the emerging optical information. A decoding unit coupled to the CCD then determines the corresponding binary bit values of the data initially encoded and holographically stored. This assignment is accomplished, e.g., via analog-to-digital conversion. Once in digital form, processing of the data according to the coding scheme used is performed to determine the data states of the original information.

However, CCDs require a highly specialized fabrication process and thus are relatively expensive for large scale manufacturing. Furthermore, CCDs are passive elements that require additional circuitry and are electrically inefficient. Also, the number of potential analog-to-digital conversions make such processing inefficient.

As an alternative to using CCDs in page-wise memories, detector arrays such as CMOS detector arrays are being explored. The use of a CMOS detector array such as an active pixel sensors (APS) for detecting recalled data emerging from a memory page provides numerous advantages compared to the use of CCDs. For example, unlike CCDs, CMOS APSs are randomly addressable. Also, compared to CCDs, CMOS APSs typically are more electrically efficient, less expensive and more easily fabricated. Specifically, APSs are capable of being manufactured using conventional CMOS fabrication processes.

It is desirable to make better use of the advantageous qualities of active pixel sensors and other CMOS detector arrays in use with page-wise memory devices and methods.

SUMMARY OF THE INVENTION

The invention is embodied in a data receiving apparatus and method of a holographic or other page-wise memory system for processing information read from the memory system's storage medium. In particular, the data apparatus includes a multi-dimensional array of pixel elements comprised of pixel detectors and corresponding pixel circuits. The pixel detectors detect information such as light information representing data stored in the memory system, and the pixel circuits determine a value representative of the information detected by the individual pixel detectors. Additionally, the apparatus includes active processing circuitry advantageously fabricated in conjunction with the pixel circuits to provide additional "on-chip" processing capabilities, including inter-pixel processing in the analog domain. The advantageous arrangement of the additional processing improves processing times, reduces the unprocessed data flow out of the receiver, and reduces circuitry design space and cost.

DETAILED DESCRIPTION

Figure 1:
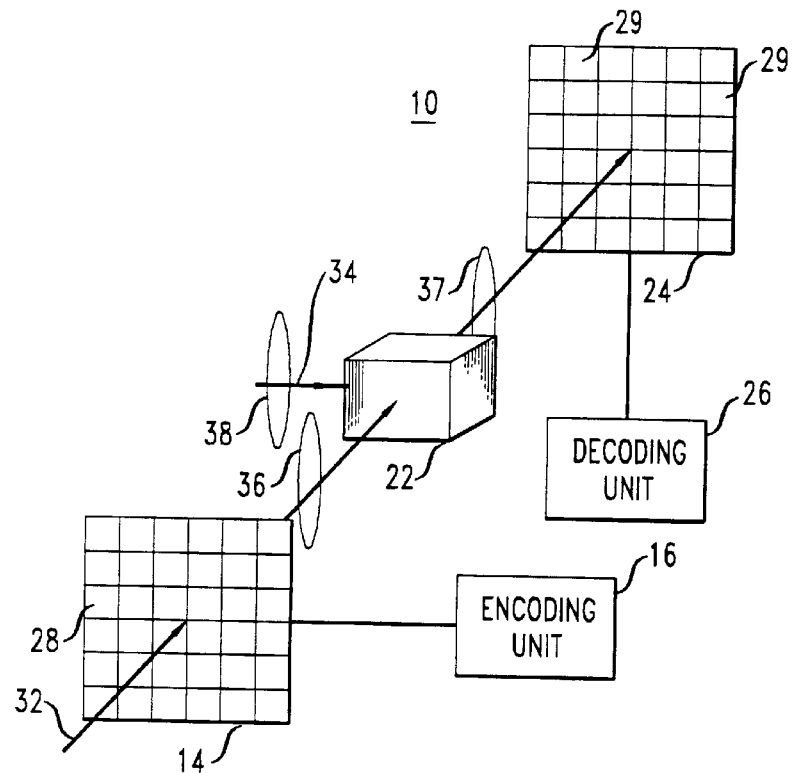
FIG. 1 is a perspective, schematic view of a conventional holographic memory system.

In the following description similar components are referred to by the same reference numeral in order to simplify the understanding of the drawings.

The invention is described primarily in terms of a particular embodiment, namely, holographic memory systems and methods for processing data within holographic memory systems. However, the invention is not limited only to such memory systems, as will be appreciated by those skilled in the art. Thus, it should be understood that embodiments of the invention are suitable for use, e.g., in other page-wise memory systems.

FIG. 1 illustrates a conventional configuration of one type of a page-wise memory system, e.g., a holographic memory system 10. Memory system 10 as shown comprises a modulating device 14 with a corresponding data encoding unit 16, a storage medium 22, and a sensor or detector 24 with a corresponding decoding unit 26.

Modulating device 14 is any device capable of optically representing a multi-dimensional array (e.g., a two dimensional page) of individual data members. For example, modulating device 14 is a spatial light modulator (SLM) having an array of pixels (shown as 28) that correspondingly represents a two dimensional array of data members in the form of clear and opaque squares on a display such as a liquid crystal display (LCD). Each square represents a corresponding data pixel and the specific arrangement of the clear and opaque squares on the display defines, at a given time, a two dimensional page of encoded data.

It should be understood that encoded data comprises both channel data and user data. User data is the actual data that subsequently is encoded for storage and decoded upon retrieval from storage. Channel data comprises user data along with non-user data such as encoding, error correction and/or control information data. Therefore, more than one bit of channel data typically is required to encode one bit of user data.

Conventionally, encoding unit 16 converts user data into channel data and encodes pixels 28 accordingly. Based on its encoded pixels 28, SLM 14 selectively passes or blocks desired portions of a signal beam 32 passing therethrough in a manner corresponding to the values of a given channel data page. Accordingly, the signal beam 32 emanating from modulating device 14 represents an encoded channel data page image.

In general, the encoded channel data page image is stored by interfering the portion of the signal beam representing the encoded channel data page image with a reference beam 34 at a location in multiplexing space within storage medium 22. The intersection of the encoded signal beam and reference beam 34 creates an interference pattern (also known as a hologram) that is captured or imprinted within storage medium 22, e.g., as a pattern of varying refractive index and/or absorption (i.e., an exact copy of the hologram). The encoded signal beam is propagated by lens 36 before combining with reference beam 34 (propagated by a lens 38) within storage medium 22. Storage medium 22 comprises, e.g., a crystal of lithium niobate, photographic film, photopolymer, photochromatic or other light sensitive recording medium.

Upon storage of the channel data page image, a new channel data page image is created on SLM 14 according to encoding unit 16. Then, a new channel data page image is stored in the manner described above in a different "location" in multiplexing space within storage medium 22. For example, it is possible to store the new data page image at a different physical location within storage medium 22 (i.e., spatial multiplexing) or to superimpose the new data page image in the same physical location but at a different angular step between reference beam 34 and the encoded signal beam (i.e., angle multiplexing) or at a different wavelength of the light beams used (i.e., wavelength multiplexing). Additional user data is encoded and stored as channel data on a page-by-page basis in this manner, as desired.

Once stored in storage medium 22, each stored channel data page image is retrieved by directing its respective reference beam 34 into storage medium 22 (e.g., from the same angle at which it entered during storage) to reconstruct the specific stored channel data page. The reconstructed channel data page image is propagated through a lens 37 and then detected by using an appropriate sensor 24, i.e., a sensor capable of sensing all data elements reconstructed from the stored channel data page. For example, sensor 24 is a charged coupled device (CCD), an active pixel sensor (APS) or other appropriate device capable of reading out or detecting page-wise data information. Typically, sensor 24 has a passive array of pixel detectors 29 corresponding to that of modulating device 14 and sensitive to the light beam emanating from storage medium 22. Alternatively, sensor 24 has more pixels than SLM 14 and employs conventional oversampling techniques whereby a group of pixels (e.g., a 4×4 or 3×3 group of pixels) is used to detect each encoded pixel 28 from SLM 14. In either case, the optical information captured by pixel detectors 29 of sensor 24 are decoded into user data, e.g., by decoding unit 26, or are further stored, transferred, accessed or manipulated in a conventional manner.

Figure 2:
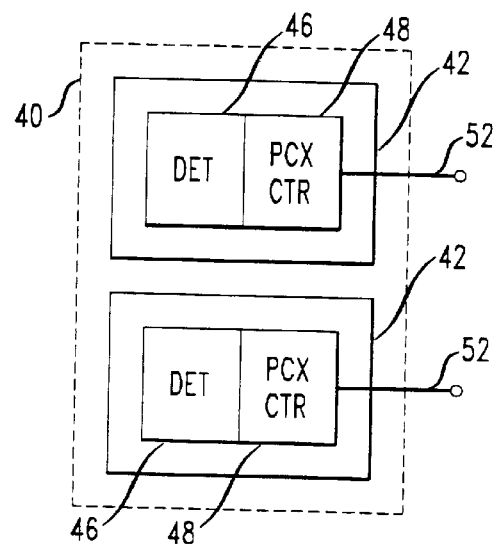
FIG. 2 is a schematic diagram of an array of pixel elements according to an embodiment of the invention.

According to embodiments of the present invention, sensor 24 also includes active circuitry coupled to the passive pixel detectors 29, thus forming an active device, e.g., a data receiver. For example, as shown in FIG. 2, a receiver 40 is comprised of an array of active pixel elements 42, which include a pixel detector 46 and an associated pixel circuit 48 coupled thereto. Pixel detectors 46 detect information, e.g., optical information, and the associated pixel circuits 48 process the information according to their particular circuit arrangement.

For purposes of discussion in this description, the term "process" in connection with pixelated information is not limited by but is understood to include functions such as reading, storing, modifying, scaling, transferring, transmitting, assigning a value to and/or otherwise manipulating information signals, such as the electrical signals generated by one or more pixel detectors 46.

Pixel detectors 46 include optoelectric devices such as photodiodes, photogates, phototransistors, or other suitable devices. Such devices sense light and generate electrical or other appropriate signals in relation to the amount of light sensed thereby.

Pixel circuits 48 include any fabricated circuitry adapted for coupling to one or more pixel detectors 46. Typically, because of similarities in fabricating pixel detectors 46 and fabricating pixel circuits 48, it is advantageous for an embodiment of the invention to fabricate pixel detectors 46 and their corresponding pixel circuits 48 on the same device, e.g., on a CMOS integrated circuit (IC) chip. In this manner, the embodiment of the invention increases the size effectiveness and the cost effectiveness of the overall device. However, it is within the scope of the invention to fabricate one or more pixel detectors 46 and their corresponding pixel circuit 48 separately, i.e., on separate devices, if desired.

Pixel element 42 has an output 52 for reading out the information in pixel element 42. Output 52 is coupled to the pixel circuit 48 in such a way that information detected by pixel detector 46 is processed by pixel circuit 48 prior to being read out of pixel element 42.

As an example, pixel circuit 48 is a circuit arrangement that takes the electrical signal generated by pixel detector 46 and assigns it a corresponding analog value. In this manner, pixel element 42 outputs analog values, i.e., voltages or currents, representative of the optical or other information detected by pixel detector 46. Alternatively, pixel circuit 48 includes appropriate analog-to-digital (A/D) conversion circuitry (not shown) to convert the assigned analog value to its digital equivalent prior to being read out of pixel element 42. Accordingly, pixel element 42 would output digital values representative of the optical or other information detected by pixel detector 46.

Figure 3A:
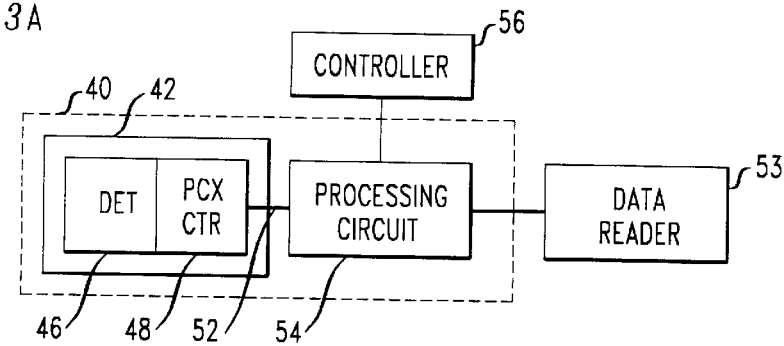
FIGS. 3a–c are schematic diagrams illustrating pixel information processing according to embodiments of the invention.

Also, as shown in FIG. 3*a*, an additional processing circuit 54 or circuitry is coupled to pixel elements 42 via pixel circuit 48. Accordingly, information processed by pixel circuit 48 and subsequently read out from pixel element 42 is processed further by processing circuit 54. Optionally, a data reader 53 is coupled to processing circuit 54 for reading out the information processed by processing circuit 54 in a conventional manner.

A controller 56 is operably coupled to processing circuit 54 for controlling the operation of processing circuit 54. For example, processing circuit 54 has a number of possible configurations that perform any of a number of functions, depending on which configuration or configurations are chosen by controller 56 for operation. Thus, in one sense, controller 56 "programs" processing circuit 54 and, through the use of controller 56, adds what is effectively a dynamic hardwiring capability to processing circuit 54 in that multiple circuit configurations, which typically would have to be hardwired individually, are now possible from a single processing circuit 54. The operation of processing circuit 54 is determined by controller 56 via appropriate hardware and/or software in a conventional manner.

With the presence of additional processing circuitry, i.e., processing circuit 54, the processing performed by pixel circuit 48 is viewed, for example, as preliminary processing or "pre-processing" of the information signals generated by pixel detectors 46 for later processing by processing circuit 54. Thus, processing circuit 54 enables embodiments of the present invention to read and process any and all pixel data as desired before being read out of the receiver 40.

Figure 3B:
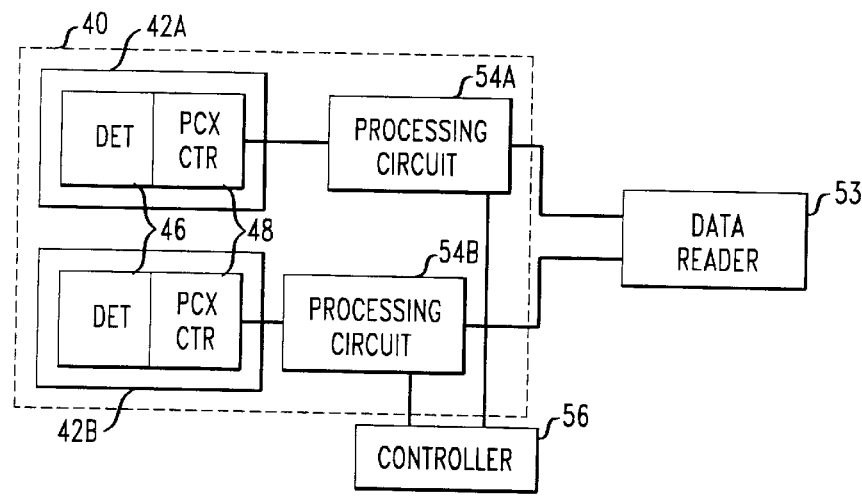

As shown in FIG. 3*b*, each pixel element 42*a*, 42*b* has associated therewith its own processing circuit 54*a*, 54*b*, respectively. A single controller 56 controls processing circuits 54*a*, 54*b* in a manner similar to that described above; however, each processing circuit is capable of having its own controller. Similarly, one or more data readers (shown as data reader 53) optionally is coupled to the respective outputs of processing circuits 54*a*, 54*b* for reading out the information processed by processing circuit 54.

Figure 3C:
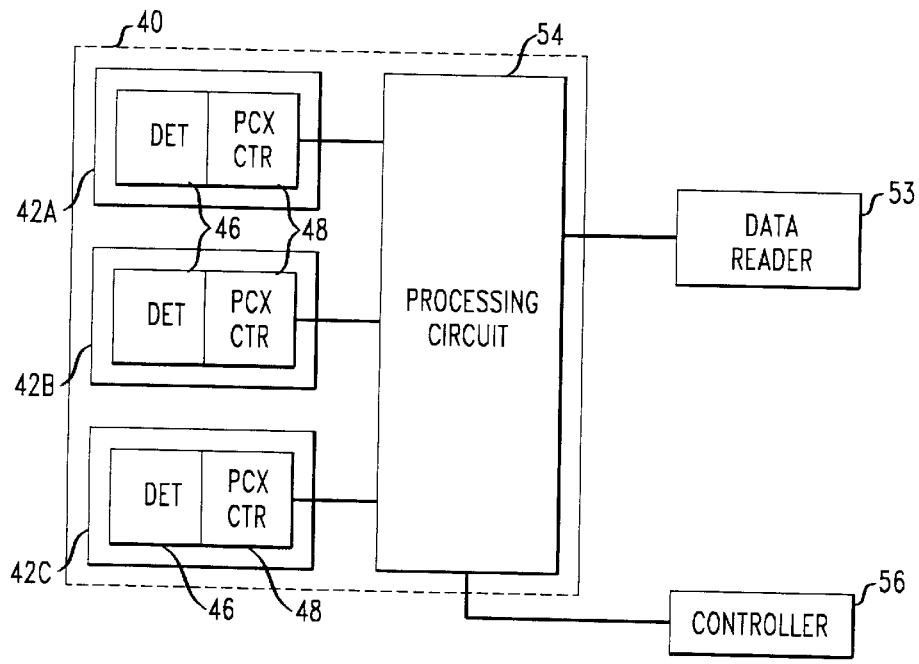

Although the processing circuitry shown in FIGS. 3*a*–*b* is advantageous for embodiments of the invention, additional processing circuitry is especially advantageous in an embodiment of the invention, e.g., as shown in FIG. 3*c*, in which a single processing circuit 54 is coupled to more than one pixel element, e.g., 42*a*, 42*b* and 42*c*. Such arrangement, unlike conventional pixel element devices, allows inter-pixel processing, which includes suitable processing by and between any and all pixel elements 42, including direct comparative processing by and between any and all pixel elements 42.

For example, one type of inter-pixel processing involves determining data states of pages having differentially encoded data elements therein. In a typical form of differential encoding, an individual data state is represented by the comparison of a first data element to a second data element. Therefore, inter-pixel processing is advantageous in determining which two data elements are to be compared and for determining the result of the comparison.

Figure 4A:
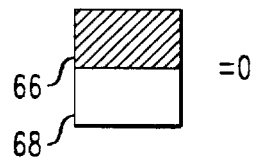
FIGS. 4a–b are schematic diagrams illustrating differential encoding of a pair of data elements according to an embodiment of the invention.
Figure 4B:
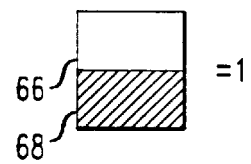

For example, FIGS. 4*a*–*b* illustrate a conventional differential encoding scheme in which a single data bit (e.g., a logical "0" or "1") is represented by a pair of data members. According to this encoding scheme, the determined data state (i.e., "0" or "1") is based on the value of a first data member 66 relative to a second data member 68. In this manner, two data members are needed to represent a single data bit, thus the theoretical maximum data storage efficiency according to this coding scheme approaches approximately 50%.

As shown in FIG. 4*a*, according to this particular coding scheme, a hatched first data member 66 and a clear second data member 68 is determined to be, e.g., a logical low or "0". Similarly, as shown in FIG. 4*b*, a clear first data member 66 and a hatched second data member 68 is determined to be a logical high or "1".

In an alternative form of differential encoding, one or more data elements are compared to a designated reference data element. In conjunction with this encoding scheme, which typically is referred to as local-reference encoding, inter-pixel processing is advantageous in identifying the reference data element, determining which data elements are to be compared to the reference data element, and determining the results of the comparisons.

Figure 4C:
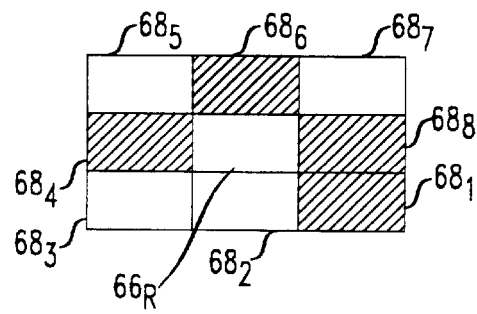
FIG. 4c is a schematic diagram illustrating local-reference differential encoding within a sub-array of data members according to an embodiment of the invention.

For example, as shown in FIG. 4*c*, within a 3×3 sub-array of data, a single reference data member $66_r$ is used for comparisons with eight other data members $68_1$–$68_8$ to determine the data states of eight data bits. That is, the comparison of reference data member $66_r$ to data member $68_1$, represents a first data state (i.e., logical "0" or "1"); the comparison of reference data member $66_r$ to data member $68_2$ represents a second data state (i.e., logical "0" or "1") and so forth.

In this local-reference encoding scheme, it is possible to represent eight data bits using only nine data members (eight data members $68_1$–$68_8$ and the reference data member $66_r$). The encoding efficiency of such scheme compares favorably with that of the encoding scheme shown in FIGS. 4a–b, which requires sixteen data members (2 data members per data bit) to represent eight data bits.

Also, see co-pending application "Comparator-Based Thresholding Method For Determining Data Values", Ser. No.: 08/777,154, filed on even date herewith and assigned to the assignee of this application. In this application, the encoding efficiency is minimized theoretically by using collective assessments of the data members themselves to provide comparative reference thresholds.

As discussed above, controller 56 determines which processing functions from processing circuit 54 are selected for operation to the extent that dynamic interconnection between one or more pixel elements is achieved. Also, this increased pixel interconnection capability, compared to conventional arrangements, provides for additional processing to occur between pixel elements 42 "on-chip", that is, without having to read out (and possibly convert, e.g., to digital values) the respective pixel information prior to the inter-pixel processing. Also, one or data readers (shown as data reader 53) optionally is coupled to processing circuit 54 for reading out information processed by processing circuit 54.

Again, fabrication of some or all of processing circuit 54 is similar to fabrication of the pixel elements (i.e., pixel detectors 46 and pixel circuits 48), thus processing circuit 54 is suitable for fabrication on the same device as the pixel elements. Furthermore, because these fabrication requirements are similar, the inter-pixel processing arrangements described above and shown, e.g., in FIG. 3c, are achieved without unduly increased burdens on the normal fabrication and size constraints of the overall system. However, if desired, processing circuit 54 is suitable for fabricating on a separate device and operably connected to pixel element 42 in a conventional manner.

The efficiencies gained by fabricating processing circuit 54 "on-chip" as described herein allows varying degrees of parallel processing to occur, thus making the performance of page-wise memory systems according to embodiments of the invention more responsive, less complex and thus more efficient. Such is compared with conventional memory systems, e.g., those using CCD detector arrays, which are limited by, e.g., the serial readout rate of the pixel elements in the array via a raster scan approach, and the accuracy of such readout techniques that suffer from pixel streaking and pixel blooming. Similarly, conventional memory systems using active pixel sensors are limited by A/D conversions occurring prior to digital inter-pixel processing and the processing time required to perform such conversions.

Examples of "on-chip" processing functions that are satisfied advantageously using embodiments of the invention include, e.g., analog comparisons between data pixels encoded according to conventional methods, page normalization code implementation, error correction code implementation, page-wise or pixel group-wise gain adjustment, redundant column-wise or pixel-wise A/D conversion, correlation and/or Fast Fourier Transform (FFT) functions, "winner-take-all" processing, multi-pixel comparisons, vector-encoded signal processing, and optimization of pixel exposure times and signal to noise ratios.

Figure 5A:
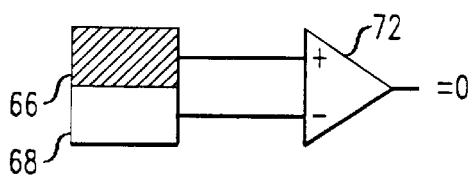
FIGS. 5a–c are schematic diagrams illustrating differential encoding of a pair of data elements using an analog comparator according to an embodiment of the invention.
Figure 5B:
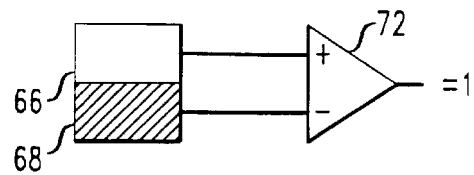
Figure 5C:
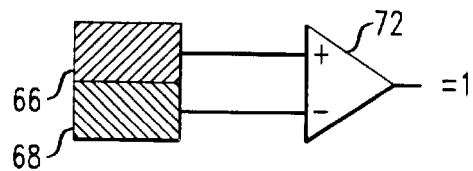

For example, as shown in FIGS. 5a–b, an analog comparator 72 is used for providing analog comparisons between differentially encoded data pixels 66 and 68. Also, as shown in FIG. 5c, a data state is obtainable even though the two data pixels being compared are less than desirable in terms of individual readability.

Figure 5D:
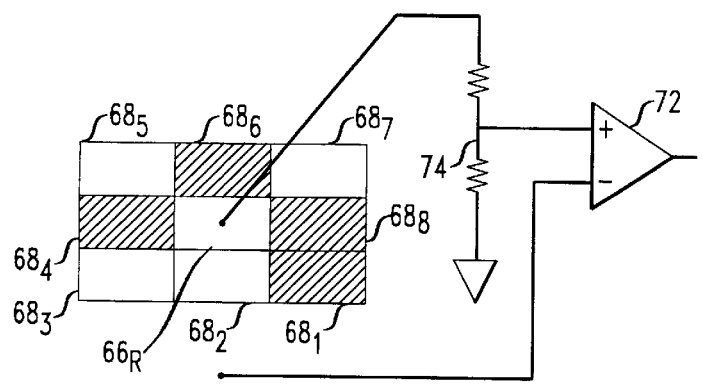
FIGS. 5d–e are schematic diagrams illustrating local-reference differential encoding within a sub-array of data members using an analog comparator according to an embodiment of the invention.
Figure 5E:
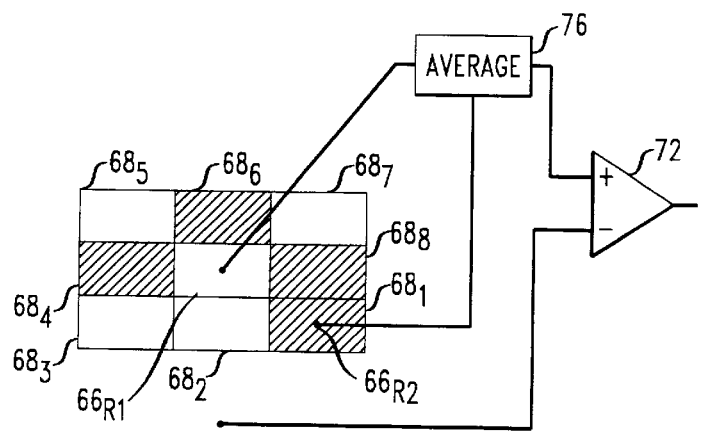

Furthermore, as shown in FIGS. 5d–e, an analog comparator 72 is useful for providing analog comparisons, e.g., within local-reference encoding environments. For example, in FIG. 5d, using a reference data pixel $66_r$ having a known value and a voltage divider 74 connected to the inverting input of comparator 72 as shown, the analog values of data pixels $68_1$–$68_8$ are determinable by individual comparison with reference data pixel $66_r$ via the noninverting input of comparator 72.

However, in applications such as holographic memory systems, the contrast between data pixels of a first data state and a second data state often is difficult to discern. Thus, an alternative comparator arrangement (shown in FIG. 5e) is useful for analog, differential comparisons of data pixels within local-reference encoding schemes. In this arrangement, additional circuitry (shown as 76) is used to establish an average value of a first known reference data pixel $66_{r1}$ having a first data state and a second known reference data pixel $66_{r2}$ having a second data state. The average value is connected to the inverting input of comparator 72 and used as a threshold in determining the data states of the data pixels $68_1$–$68_7$, which are individually connected to the noninverting input of comparator 72, as shown.

Using such arrangement, it is possible to represent seven data bits using only nine data members (seven data members $68_1$–$68_7$ and the two reference data members hu $66_{r1}$ and $66_{r2}$). The encoding efficiency is just slightly less than that of the arrangement shown in FIG. 5d, but the accuracy of determining the respective data states of the data pixels improves within applications whose data state discernability is less than desirable.

In the arrangements shown in FIGS. 5a–e, comparator 72 is fabricated, e.g., "on-chip" within processing circuit 54 so that the inputs to comparator 72 are connected to the particular data pixels as appropriate for proper data comparison. Data pixels 66 and 68 correspond, e.g., to pixel detectors 42a and 42b, respectively, shown in FIG. 3c.

Using the arrangement shown in FIGS. 5a–b, it is possible for an appropriate number of comparators fabricated within processing circuit 54 to simultaneously determine the encoded data states of a plurality of encoded data pixels in the analog domain prior to the data being read out of processing circuit 54. In this manner, the amount of data being read out of processing circuit 54 typically is decreased by approximately 50%.

Figure 6:
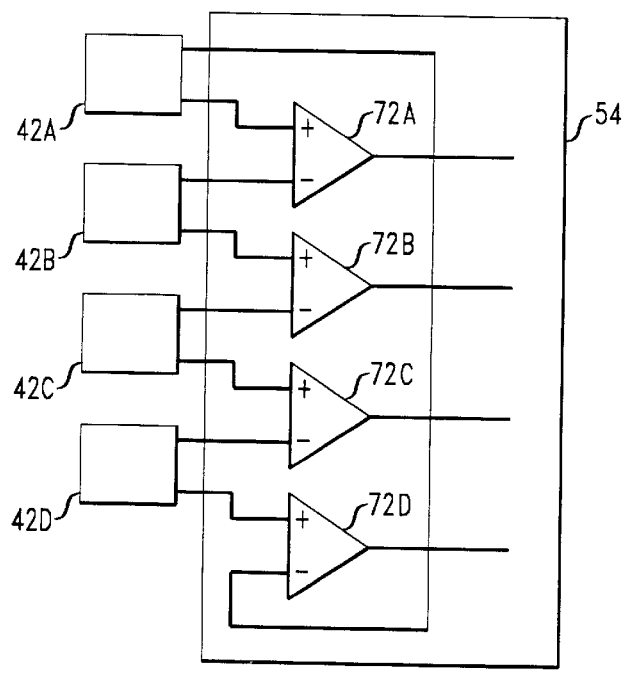
FIG. 6 is a schematic diagram illustrating a fuzzy logic arrangement of a portion of a row of data elements according to an embodiment of the invention.

Another example of "on-chip" processing with analog comparators involves conventional "fuzzy logic" arrangements. As shown in FIG. 6a, comparators 72a, 72b, 72c and 72d are fabricated "on-chip" within processing circuit 54 and connected to a portion of a row of pixel detectors, e.g., pixel detectors 42a–d. In such arrangement, conventional fuzzy logic processing is performed, in the analog domain, within processing circuit 54 prior to the resulting data being read out of processing circuit 54.

Figure 7A:
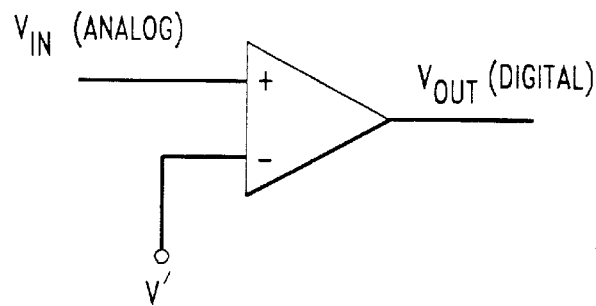
FIGS. 7a–c are schematic diagrams illustrating an analog-to-digital conversion arrangement using an analog converter according to an embodiment of the invention.
Figure 7B:
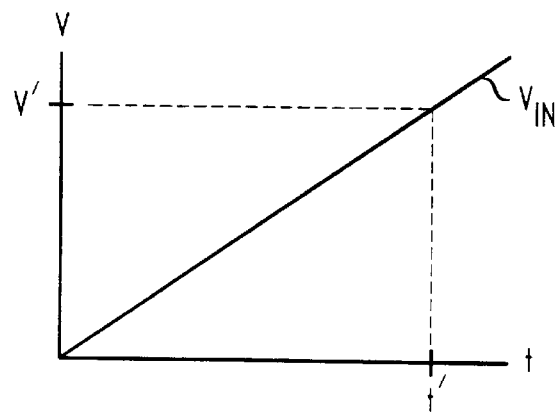
Figure 7C:
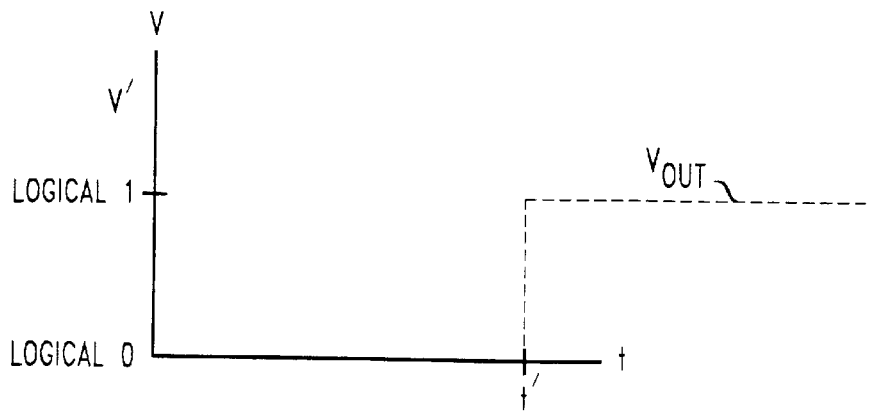

In alternative embodiments of the invention, the "on-chip" processing performs analog-to-digital conversion of the information received by the pixel elements of receiver 40. Such processing is achieved through the use of an appropriate number of A/D converters within processing circuit 54. For example, an analog comparator 72 as shown in FIG. 7a converts an analog signal connected to the noninverting input to a digital high or low data state according to the input and output plots shown in FIGS. 7b–c.

As shown, the digital output of comparator 72 remains a logical low until the analog value of the noninverting input voltage of comparator 72 exceeds a threshold value V', upon which time the digital output of comparator 72 changes state to a logical high. The value of threshold voltage V' is determined, e.g., by the relationship between one or more data pixels as discussed previously or, alternatively is established independent of the data pixel values.

Figure 8C:
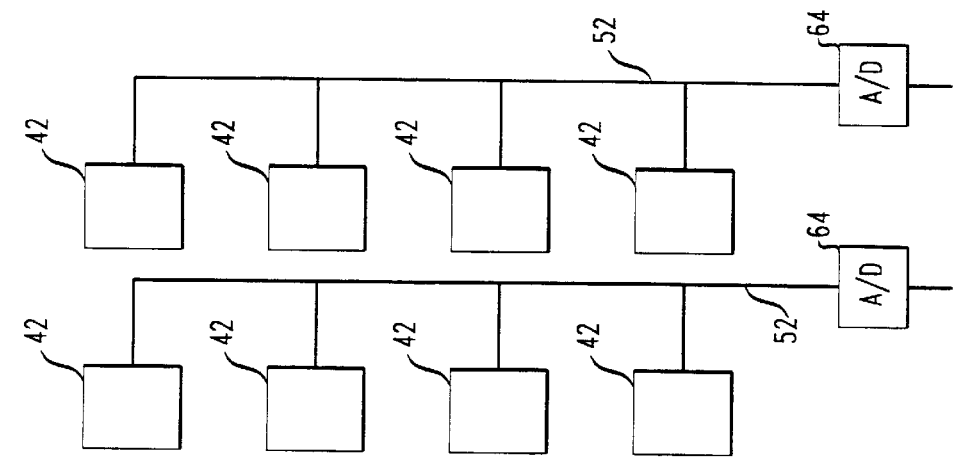
FIGS. 8a–c are schematic diagrams illustrating various analog-to-digital conversion arrangements according to alternative embodiments of the invention.
Figure 8B:
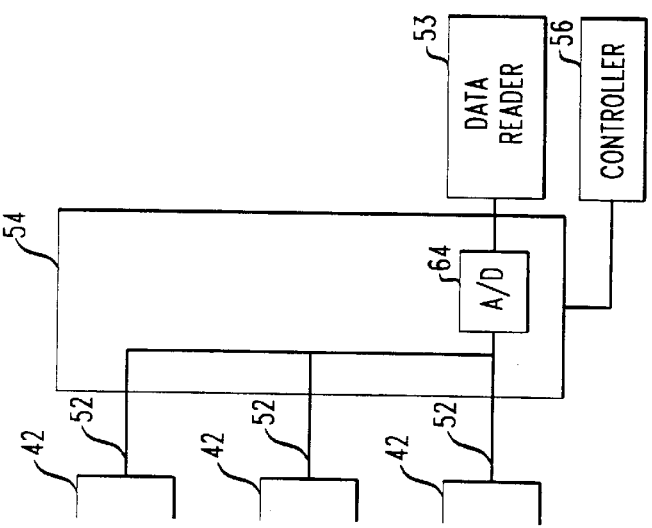
Figure 8A:
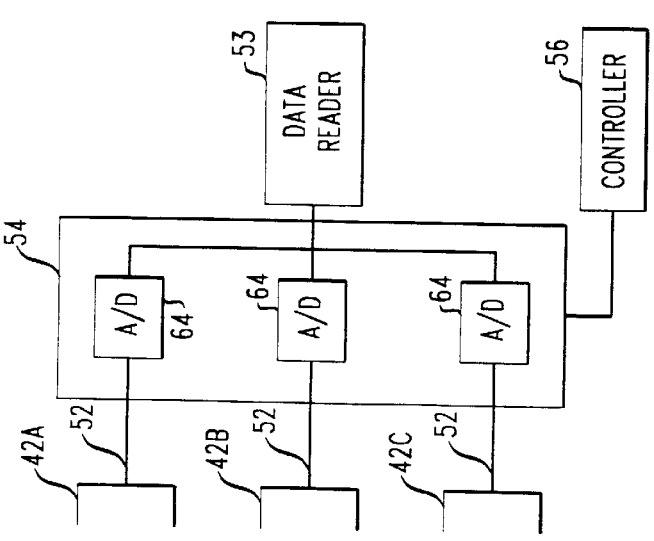

As shown in FIGS. 8a–c, it is possible to connect an A/D converter 64 to the output of each pixel element 42 (FIG. 8a) or each column of detector pixel elements (FIGS. 8b–c). Such arrangements will reduce the processing time and increase the data readout rates of the device.

However, it should be understood that increasing the number of A/D converters not only increases processing speed, but also increases the complexity of the "on-chip" circuitry. But, compared to increased A/D converters, the use of increased "on-chip", analog "pre-processing" circuitry increases processing speed with only a moderate increase in the complexity of the "on-chip" circuitry.

Although pixel elements are depicted herein in a manner that may suggest comparisons between adjacent pixel elements only, it should be noted that such requirement is unnecessary. Processing circuit 54 is capable of being fabricated and/or operated via controller 56 in any desired arrangement and for any desired function with respect to pixel elements 42 and pixel circuits 48. Therefore, for example, pixel elements 42 and their corresponding pixel values are randomly addressable and, similarly, are randomly comparable. Such flexibility is advantageous compared to data manipulation and processing within conventional memory storage systems.

In the manner just described, embodiments of the invention are particularly advantageous for applications such as error correction, and/or automatic gain control (AGC) activity. Because of the often intensive processing necessary for such applications, high resolution digital circuitry (e.g., at least 10 bits) or, alternatively, analog circuitry is desired, which heretofore has been impractical from a fabrication standpoint. Thus, the ability of embodiments of the invention to perform processing activities in the analog domain is well suited for AGC applications.

For example, it is possible to incorporate AGC activity within page-wise memory systems such as holographic memory systems with regard to normalizing the values of stored data across a holographic storage medium. As mentioned previously, the storage of data within holographic storage media is less than consistent due to a number of inherent internal and external factors. Such inconsistency often results in data strength variances within the storage media from one data page image to the other and even within the same data page image. However, because embodiments of the invention make "on chip" analog processing circuitry practical, it is possible to include AGC circuitry, which detects, e.g., trends of data strength across the data image and normalizes the respective data values accordingly prior to or as the data values are being read out from storage medium 22. See, for example, see co-pending application "Method For Modulating Data For Storage In Page-wise Memory", Ser. No.: 08/777,153 filed on even date herewith and assigned to the asssignee of this application.

Although normalizing data values across a data image is one example of an advantageous application of AGC, it will be apparent to those skilled in the art that many other advantageous AGC applications are made available by the practicality of "on chip" analog processing according to embodiments of the invention. Furthermore, it will be apparent to those skilled in the art that many changes and substitutions can be made to the embodiments of the page-wise memory data processing apparatus and methods herein described without departing from the spirit and scope of the invention as defined by the appended claims and their full scope of equivalents.

What is claimed is:

1. Apparatus for receiving data stored in a page-wise memory device, said apparatus comprising:
   a multi-dimensional array of pixel elements, at least one of said pixel elements having
      a pixel detector for detecting at least a portion of the data from said page-wise memory device, and
      a pixel circuit coupled to said pixel detector for providing a pixel value representative of the data detected by said pixel detector; and
   a processing circuit coupled to the pixel circuit of at least one of said pixel elements for processing the pixel values of one or more of said pixel circuits, said processing based on comparisons of pixel values with one another.

2. The apparatus as recited in claim 1, further comprising a controller coupled to said processing circuit for controlling which of said pixel values will be processed.

3. The apparatus as recited in claim 1, wherein said processing circuit has an output for reading out the pixel values processed by said processing circuit.

4. The apparatus as recited in claim 3, wherein said processing circuit includes at least one analog-to-digital converter for converting said pixel values into corresponding digital values prior to being read out of said processing circuit.

5. The apparatus as recited in claim 1, further comprising a data reader coupled to the output of said processing circuit for reading out and storing the processed data from said apparatus.

6. The apparatus as recited in claim 1, wherein at least a portion of the data stored in said page-wise memory device is differentially encoded and wherein said processing circuit generates at least one signal representative of a differentially encoded data state based on said differentially encoded data.

7. The apparatus as recited in claim 1, wherein at least a portion of the data stored in said page-wise memory device is local-reference encoded and wherein said processing circuit generates at least one signal representative of a data state according to a local-reference encoding scheme.

8. The apparatus as recited in claim 1, wherein said page-wise memory device is an optical memory device, and wherein said array of pixel elements is an optoelectric device.

9. The apparatus as recited in claim 1, wherein said page-wise memory device is an optical memory device, and wherein said array of pixel elements is an active pixel sensor.

10. The apparatus as recited in claim 1, further comprising at least one analog-to-digital converter coupled to at least one of said pixel circuits for converting the analog value determined by said pixel circuit into a corresponding digital value.

11. Apparatus for receiving data stored in a holographic memory device, said apparatus comprising:
   a multi-dimensional array of pixel elements for reading the data values of at least a portion of the data stored in said holographic memory device, at least one of said pixel elements having a pixel detector for receiving projection from said holographic memory device, said pixel detector detecting at least one projected data element stored in said holographic memory, and a pixel circuit coupled to said pixel detector for providing pixel values of the data elements detected by said pixel detector; and a processing circuit coupled to said pixel circuits for processing said pixel values based on comparisons of said pixel values, said processing circuit processing said pixel values prior to said pixel values being read out of said apparatus.

12. The apparatus as recited in claim 11, further comprising a controller coupled to said processing circuit for determining which of said pixel values are processed.

13. The apparatus as recited in claim 11, wherein said processing circuit has an output for reading out pixel values from said processing circuit.

14. The apparatus as recited in claim 13, wherein said processing circuit includes at least one analog-to-digital converter for converting said pixel values into corresponding digital values prior to being read out from said processing circuit.

15. The apparatus as recited in claim 11, wherein at least a portion of the data stored in said holographic memory device is differentially encoded and wherein said processing circuit includes at least one analog comparator for comparing at least one first pixel value to at least one second pixel value and for generating a signal representative of a differentially encoded data state based on the pixel value comparison.

16. The apparatus as recited in claim 11, wherein at least a portion of the data stored in said page-wise memory device is local-reference encoded and wherein said processing circuit includes at least one analog comparator for comparing a reference value represented by a first pixel value to one or more pixel values and for generating a plurality of signals representative of data states according to a local-reference encoding scheme based on the comparisons.

17. The apparatus as recited in claim 15 or 16, wherein said processing circuit is configured to perform analog comparisons of said pixel values.

18. The apparatus as recited in claim 15 or 16, further comprising a data receiver coupled to the output of said processing circuit for receiving signals representing indicated data states transferred out of said holographic memory device.

19. The apparatus as recited in claim 11, wherein said array of pixel elements is an array of active pixel sensors.

20. A method for processing data stored in a holographic memory device, said method comprising the steps of:

detecting a projection of at least a portion of said data stored in said holographic memory device;

providing pixel values representative of the detected data;

comparing at least one pixel value with at least one other pixel value prior to analog-to-digital conversion of said pixel values; and generating at least one signal representative of the comparison of the pixel values.

21. The method as recited in claim 20, wherein at least a portion of the data stored in said holographic memory device is differentially encoded, and wherein said comparing step further comprises comparing at least one first pixel value to at least one second pixel value in the analog domain, and wherein said generating step further comprises generating a signal representative of a data state according to a differential encoding scheme.

22. The method as recited in claim 20, wherein at least a portion of the data stored in said holographic memory device is encoded according to a local-reference encoding scheme, and wherein said comparing step further comprises comparing a reference pixel value to one or more pixel values in the analog domain, and wherein said generating step further comprises generating at least one signal representative of a data state according to a local-reference encoding scheme.

23. The method as recited in claim 20, wherein at least a portion of the data stored in said holographic memory device is normalization reference data, wherein said comparing step compares at least one of a plurality of pixel values to at least one pixel value representing said normalization reference data, and wherein said generating step generates a normalization signal based on the comparisons.

* * * * *